United States Patent [19]

Desai et al.

[11] Patent Number: 5,479,703

[45] Date of Patent: Jan. 2, 1996

[54] METHOD OF MAKING A PRINTED CIRCUIT BOARD OR CARD

[75] Inventors: Kishor V. Desai, Vestal; Harold Kohn, Endwell; Richard C. Senger; Donald P. Seraphim, both of Vestal, all of N.Y.

[73] Assignee: International Business Machines Corporation, Armonk, N.Y.

[21] Appl. No.: 309,777

[22] Filed: Sep. 21, 1994

Related U.S. Application Data

[62] Division of Ser. No. 995,714, Dec. 23, 1992.

[51] Int. Cl.⁶ .............................. H05K 3/42; H05K 3/34; H05K 3/46
[52] U.S. Cl. .................... 29/852; 29/830; 29/840; 29/843; 174/263; 228/180.1; 427/97; 428/901
[58] Field of Search .................. 29/830, 840, 843, 29/852, 853, 846; 174/262, 266; 228/180.1, 180.21, 180.22, 245, 256; 361/751; 427/96, 97, 123; 428/901; 439/67

[56] References Cited

U.S. PATENT DOCUMENTS

| | | | |
|---|---|---|---|
| 3,105,729 | 10/1963 | Rosenthal et al. | 174/262 X |
| 3,320,658 | 5/1967 | Bolda et al. | 228/180.22 X |
| 3,465,435 | 9/1969 | Steranko | 29/830 X |
| 3,744,557 | 7/1973 | Costello | 228/180.1 X |
| 3,795,047 | 3/1974 | Abolafia et al. | 29/843 |
| 4,290,195 | 9/1981 | Rippere | 427/97 X |
| 4,469,777 | 9/1984 | O'Neil | 29/846 X |
| 4,906,823 | 3/1990 | Kushima et al. | 228/245 |
| 5,122,475 | 6/1992 | Heckman et al. | |
| 5,145,104 | 9/1992 | Apap et al. | 228/180.1 |
| 5,159,535 | 10/1992 | Desai et al. | 361/751 |
| 5,198,965 | 3/1993 | Curtis et al. | 439/67 |
| 5,266,748 | 11/1993 | Kawakami et al. | 174/264 X |
| 5,280,414 | 1/1994 | Davis et al. | 428/901 X |
| 5,317,801 | 6/1994 | Tanaka et al. | 29/852 X |
| 5,435,732 | 7/1995 | Angulas et al. | 29/840 X |

FOREIGN PATENT DOCUMENTS

| | | | |
|---|---|---|---|
| 56-150897 | 12/1981 | Japan | 29/852 |
| 3101191 | 4/1991 | Japan | 29/840 |
| 4151895 | 5/1992 | Japan | 29/840 |
| 5075253 | 3/1993 | Japan | 29/852 |
| 6069640 | 3/1994 | Japan | 29/840 |

OTHER PUBLICATIONS

"Forming Electrical Interconnections Through Semiconductor Wafers" Anthony T. R., J. Applied Physics, Aug. 1981, pp. 5340–5349.

IBM Technical Disclosure Bulletin, vol. 37, No. 2B, Feb. 1994, pp. 337–338.

*Primary Examiner*—Peter Vo
*Attorney, Agent, or Firm*—Pollock, Vande Sande & Priddy

[57] ABSTRACT

A multi-layer printed circuit board or card including a plurality of circuitized power cores, the circuitized power cores include a layer of an electrically conductive material having a layer of electrically insulating material attached on both sides thereof. The circuitized power cores also include a plurality of plated through holes formed therethrough in substantially the same pattern on each circuitized power core. The circuitized power cores are parallel to each other such that corresponding plated through holes in the two circuitized power cores are co-linear. A plurality of substantially spherical balls are located between the circuitized power cores and are in contact with the corresponding plated through holes on facing cards. The balls have a diameter slightly larger than the opening of the plated through holes and are made of an electrically conductive material.

1 Claim, 10 Drawing Sheets

METHOD OF MAKING A PRINTED CIRCUIT BOARD OR CARD

This is a divisional of Ser. No. 07/995,714 filed on Dec. 23, 1992.

FIELD OF THE INVENTION

The invention relates to multi-layer circuit boards and specifically to multi-layer circuit boards and cards having a high input and output channel density and methods of fabricating multi-layer circuit boards and cards.

BACKGROUND OF THE INVENTION

In assembling components for electronic devices, integrated circuit chips are mounted on multi-layer boards and cards which are then incorporated into a final product. It is known in the art to attach an integrated circuit chip to a chip carrier, often made of ceramic, which is then mounted on and secured to a multi-layer circuit board or card. Usually, the chip is soldered to the chip carrier using various known methods such as wave soldering. The chip carrier usually includes pins extending from the surface that is opposite the side where the chip is attached. These pins extend into holes formed in the circuit board or card.

The method used to attach a chip or chip carrier to the circuit board or card must ensure electrical continuity between the chip, the chip carrier, the hole in the circuit board or card into which the chip carrier pins are inserted and any electrically conductive layers of the board or card continuous with the material lining the hole. In making such an assembly, the chip carrier may be made detachable by mounting the chip carrier pins in spring clips, such as bifurcated spring connectors, which are then inserted into the holes of the circuit board or card and may be soldered or otherwise secured thereto.

Increasingly, more and more devices are incorporated on a single chip, increasing the number of input and output channels (I/O's) associated with a chip. Presently, thousands of devices have been incorporated in a single chip. As the number of I/O's increases, the number of connections between the integrated circuit and the circuit board or card and the number of holes which must be formed in the circuit board or card increases. To reduce the amount of material which must be taken away from the board or card to form a hole and to greatly and readily increase the I/O density, it became increasingly desirable to use direct chip attached methods to mount a chip directly on a printed circuit board or card.

With direct chip attachment methods, a chip is directly mounted on a circuit board using solder balls to connect the chip I/O's to the holes in the multi-layer board or card. Such balls have a much smaller diameter than the pins associated with the chip carriers allowing the removal of less material from the board or card and the closer spacing of the holes. Direct chip attachment methods usually involve placing a solder ball directly over the holes in the board or card, then placing the board or chip on top of the balls so that the location of the balls corresponds to I/O's on the chip and finally soldering the assembly together.

Such multi-layer printed circuit boards and cards used in the above applications usually include a plurality of power and signal layers separated by insulating layers, the power, signal, insulating layers being laminated together in one structure making the board or card. The holes in the board or card for attaching chips or chip carriers are often drilled either mechanically or with a laser through the laminated layers of the board or card. As the number of I/O's associated with a chip increases, the density of the holes needed in the printed circuit board or card increases. As the number of I/O's increases and direct chip methods are used, the space in between the through holes is reduced, making it increasingly difficult to form such holes through layers of the board or card.

As a means of avoiding the problems associated with a high density of holes in the board or card, multi-layer printed circuit boards or cards have been fabricated using "cores". In the "core" method of forming a multi-layer circuit board or card, a plurality of cores are first fabricated. Each core includes a power plane, upper and lower signal layers, and plated through holes extending through the thickness of the core. A circuit board or card is formed by joining two or more of the cores together.

Such cores, known as circuitized power cores (CPC's), permit the packaging of high I/O chips with the associated high wiring and via densities. When joining CPC's to form a multi-layer printed circuit board or card it is essential that the electrical connections be properly achieved between the vertically aligned plated through holes and adjacent cores. This has previously been done by applying an upper and lower "cap" to each core.

The caps consist of a layer of an electrically conductive material. This electrically conductive layer is then joined to a layer of electrically insulating material. Each cap also includes via holes extending completely through the thickness of the insulating layer. These via holes are formed in the insulating layer at points corresponding to the plated through holes in the CPC's so that when the cap is placed adjacent to the core, the vias and the plated through holes will be aligned. After the formation of the vias in the electrically insulting layer of the cap, electrically conductive material is deposited into each via hole using conventional electroplating techniques.

To join two cores together, an upper and a lower cap is first joined to each CPC using heat and pressure. The electrically conductive layer of each cap is then etched away, exposing the electrically insulating layers and the filled vias. The resulting CPC's are then properly aligned with the vias in electrical contact and laminated together using heat and pressure. The heat and pressure cause the electrically conductive material in the via holes to flow, becoming joined to the material adjacent via on the other core, thereby providing electrical connection through the aligned plated through holes in the cores.

The above described method for joining CPC's has a number of disadvantages. These disadvantages include the need to completely etch away the electrically conductive layer of each cap, wasting time, money, and material. In addition, often, the electrically conductive material deposited in these vias does not completely fill the aligned plated through holes and adjacent cores, causing electrical discontinuity between the through holes. Using the cap method of joining the CPC's, there is no assurance that electrical continuity will be achieved in all of the through holes. Further, in a relatively thick board or card, with a large number of layers, difficulties might arise in detecting the exact location of an electrical discontinuity. Such discontinuity might also necessitate the reworking of the board or card, consuming additional time and materials.

SUMMARY OF THE INVENTION

The present invention solves problems existing in the prior art by providing a circuit board or card including a first and a second circuitized power core. Both of the circuitized power cores include a layer of an electrically conductive material having a layer of electrically insulating material attached on both sides thereof. Both of the power cores also include a plurality of plated through holes formed therethrough in substantially the same pattern on each circuitized power core. The circuitized power cores are parallel to each other such that corresponding plated through holes in the two circuitized power cores are co-linear.

A plurality of substantially spherical balls are located between the circuitized power cores and are in contact with corresponding plated through holes on both cards. The balls have a diameter slightly larger than the opening of the plated through holes and are made of an electrically conductive material.

The present invention also includes a method of making a printed circuit board or card including the steps of forming a) circuitized power core by depositing an electrically insulting layer on a top side and a bottom side of a planar electrically conductive material;

b) forming a plurality of holes through the circuitized power cores from the top side to the bottom side;

c) plating electrically conductive material on the surface of the through holes and on the top and bottom surfaces of the electrically insulating layers of the circuitized power core adjacent each through hole, the material on the inside of the holes being continuous with the material on the top and bottom sides of the circuitized power core;

d) placing within a ball dispenser assembly a plurality of substantially spherical balls having a diameter slightly larger than the diameter of the plated through holes in the circuitized power core, the balls being made of an electrically conductive material, the balls being arranged in a pattern matching a pattern of through holes formed in the circuitized power core;

e) placing the circuitized power core over the exterior planar surface on the ball dispenser assembly, aligning the plated through holes with holes in an exterior surface of the ball dispenser assembly wherein the holes in the ball dispenser are slightly larger than the balls, and aligning location pins provided with the dispenser with location holes in the power core;

f) placing a fixture base plate over the power core and securing the base plates to the ball dispenser, the base plate being a substantially flat member;

g) introducing pressurized gas into the ball dispenser inner chamber causing the exterior surface to press against the power core and the power core to press against the base plate;

h) inverting the ball dispenser, power core, and base plate;

i) vibrating the ball dispenser, power core, and base plate causing the balls to pass through the passages in the exterior surface and become wedged at the opening of the plated through holes;

j) turning off the source of the pressurized gas;

k) heating the ball dispenser, power core, and base plate to a temperature which melts the electrically conductive material plated on the through holes but does not melt the circuitized power core or the balls;

l) reverting the ball dispenser, power core, and base plate;

m) removing the base plate and the power core from the ball dispenser.

DETAILED DESCRIPTION OF VARIOUS AND PREFERRED EMBODIMENTS OF THE PRESENT INVENTION

Figure 1:
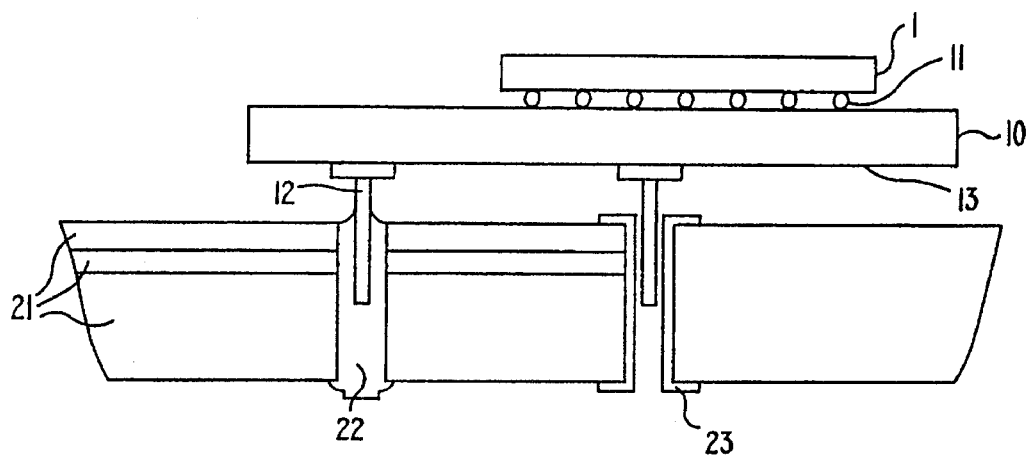
FIG. 1 represents a cross sectional view of an assembly formed using a conventional method of mounting an integrated circuit chip on a chip carrier soldered to a printed circuit board or card.

As discussed above, various methods are used to functionally attach integrated circuit chips to circuit boards or cards. FIG. 1 represents a known method of attaching an integrated chip to a printed circuit board or card. Using this method the chip 1 is attached to a chip carrier 10 using solder balls 11. The chip carrier 10 may be made of ceramic or any other material suitable for such purpose. A number of pins 12 made of an electrically conducting material are incorporated into the structure of the chip carrier 10 and extend away from the chip carrier 10 on the side 13 of the chip carrier opposite where the integrated circuit 1 is attached. The pins 12 on the chip carrier are adapted to be received by the printed circuit board or card 20. The circuit board or card 20 is generally a multi-layer composite structure composed of multiple layers 21 including various conductive layers such as power, ground, and insulating layers.

To allow for the attachment of integrated circuit chip carriers and or other components, the circuit board or card 20 has a number of passages 22 formed therethrough. These passages 22 include through holes and vias which may or may not extend completely through the board or card 20. Usually, the passages 22 are plated with an electrically conductive material 23. The various conductive layers in the border card selectively contact the conductive material 23 plated on the inside of the passages.

The pins from the chip carrier or other component are usually inserted into the holes 22 as shown in FIG. 1. Once the pins on the chip carrier are inserted into the holes of the board or card, conventional wave soldering or any other suitable soldering method is used to cause the plating material 23 in the holes to melt around the pins 12 thereby assuring electrically conductivity between the pin, the plating material, and any conductive layers in electrical contact with the through hole. The plating material 23 in the left-hand through hole in FIG. 1 has been subjected to the soldering process while the right-hand hole has not.

Figure 2:
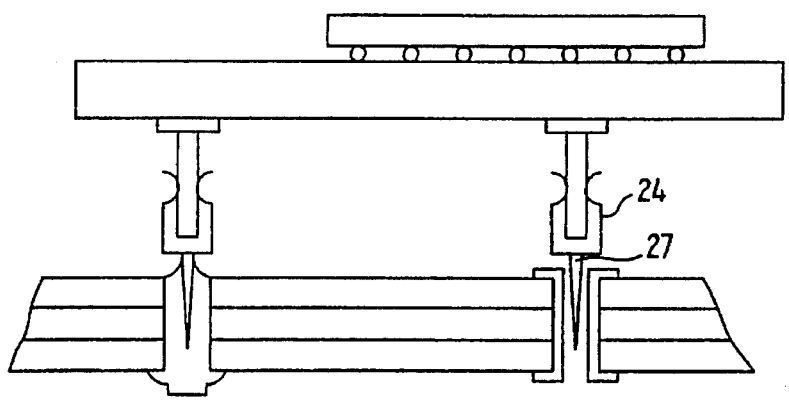
FIG. 2 represents a conventional mounting of an integrated circuit chip on a chip carrier mounted on a printed circuit board or card using bifurcated spring connectors.

As shown in FIG. 2, to enable the chip carrier and any attached chips to be easily attached from the printed circuit board or card 10, the pins 12 of the chip carrier may be mounted in springs 24 secured in the through holes of the board or card 20. According to this method, extensions 27 on the springs, which may be bifurcated spring connectors, are inserted into the through holes 22 of the circuit board or card 10 and may be soldered to the board using immersion soldering. The spring mounting method is especially useful in forming a circuit board or card including a number of modules attached thereto. Such boards typically include 4 to 6 modules per circuit board or card with a plurality of integrated circuits attached to each module.

As integrated circuit (IC) chip design technology has advanced, especially in recent years, the number of circuits included in each integrated circuit chip has vastly increased. Very large scale device integration at the chip level has resulted in thousands of circuits being included in a very small size chip. As the number of circuits on the integrated circuit increases, the number of inputs and outputs (I/O) must be increased. As the number of I/O's increases, the density of the I/O's on the circuit board increases. With an increased number of I/O's, it becomes increasingly difficult, if not impossible, to attach a chip to a circuit board using a chip carrier due to the large diameter of the pins on the chip carrier and plated through holes in the board or card.

Figure 3:
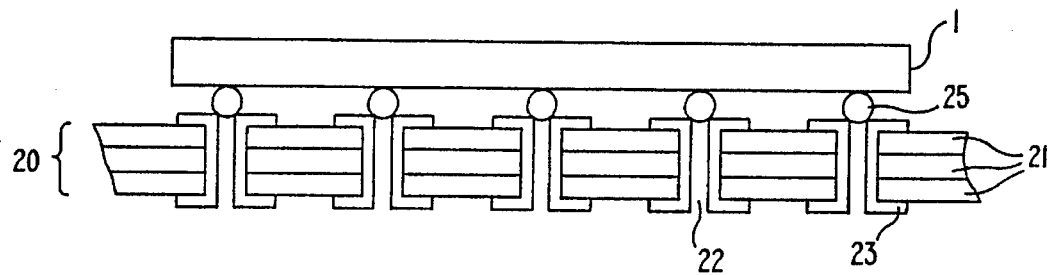
FIG. 3 represents a cross sectional view of an integrated circuit chip directly mounted on a printed circuit board or card.

To facilitate the attachment of highly integrated chips, the chips had been attached directly to the chip carriers. Direct chip attachment methods as seen in FIG. 3, include the attachment of the chip 1 directly to the circuit board or card 20 using solder balls 25. The solder balls 25 are placed at the openings of the plated through holes 22 in contact with the plating material 23. The chip is then placed on top of the card so that the solder balls contact the appropriate points on the chip. The chip solder ball and card assembly is then soldered together using known soldering techniques discussed above. Due to the much smaller size of the solder balls as compared to the pins on the chip carrier, and the smaller size of the holes formed in the board or card, many more balls may be mounted between a chip and a card or board than a pin, thereby accommodating the large number of I/O's associated with newer more highly integrated chips. The smaller size of the through holes allows the circuit boards or cards associated with such high density chips to include a higher density of through holes.

As stated above, circuit boards and cards generally include multiple conductive and/or insulting layers laminated together. With greater device integration, a reduction in plated through hole diameter and spacing between plated through holes, and an increase in the density of plated through holes, it becomes increasingly difficult to drill plated through holes through the combined thickness of all the laminated layers comprising the printed circuit board or card. Through holes are often formed by lasers and/or using mechanical drilling or punching methods.

Figure 4:
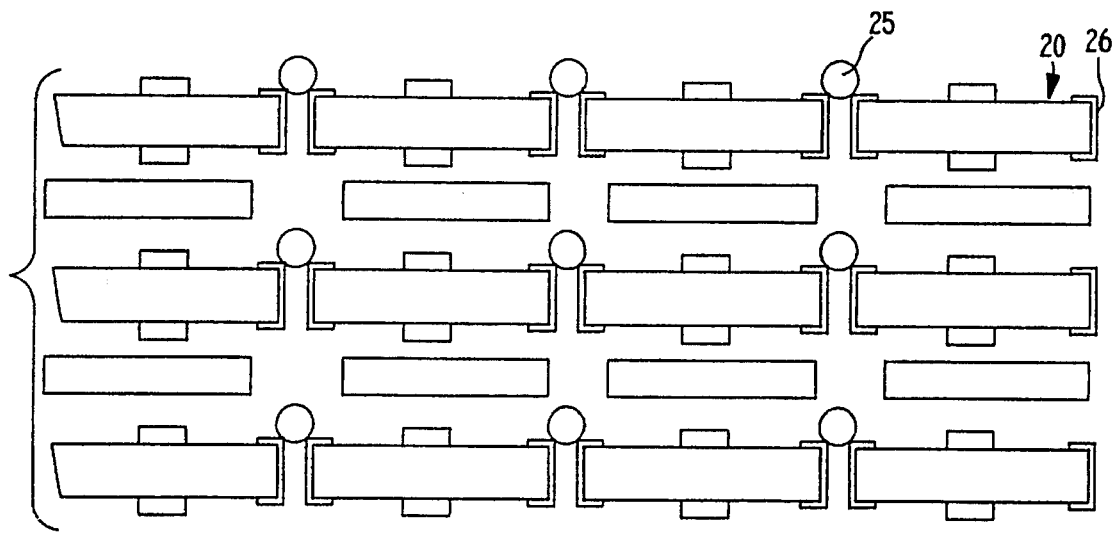
FIG. 4 represents an unassembled view of cores for fabricating a multi-layer printed circuit board or card pursuant to the present invention.

To alleviate the problems associated with drilling narrow holes through a multi-layer board or card, new methods of fabricating circuit boards and cards have been developed for building them from "cores". According to these methods, a printed circuit board or card is assembled from a plurality of cores. Each core includes a power plane and attached upper and lower signal layers. Plated through holes are formed through the entire thickness of these relatively narrow cores. These modular core units 26, as seen in FIG. 4, are then joined together at the plated through holes using solder balls 25 and the chip attached thereto.

Figure 5A:
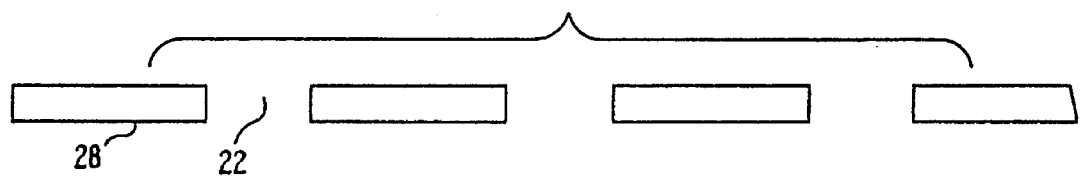
FIGS. 5a–j represent various stages in the process of forming a printed circuit board or card from cores.
Figure 5B:
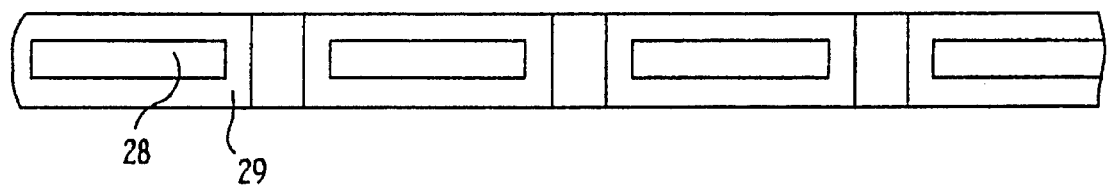
Figure 5C:
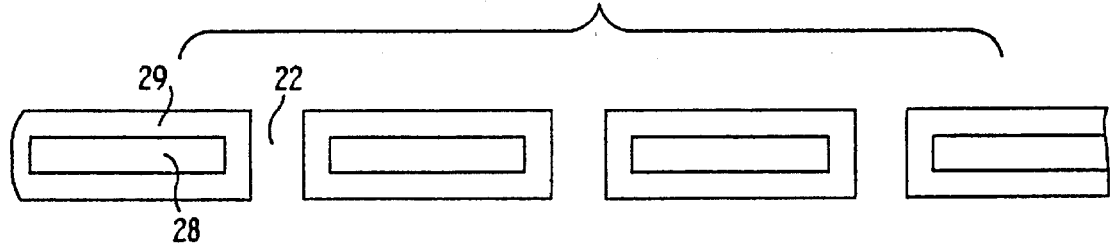
Figure 5D:
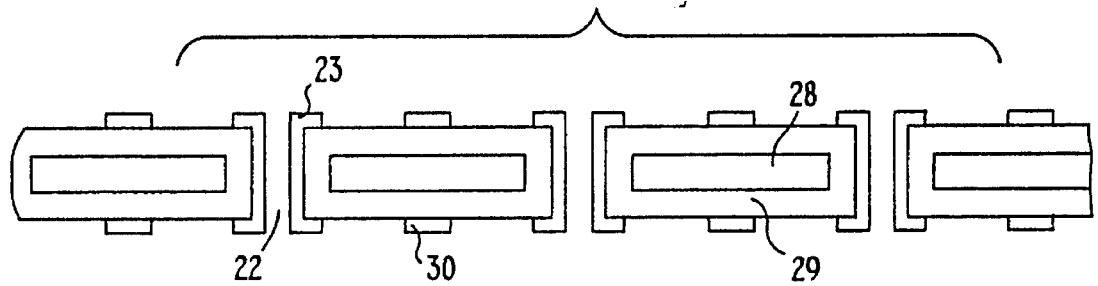
Figure 5E:
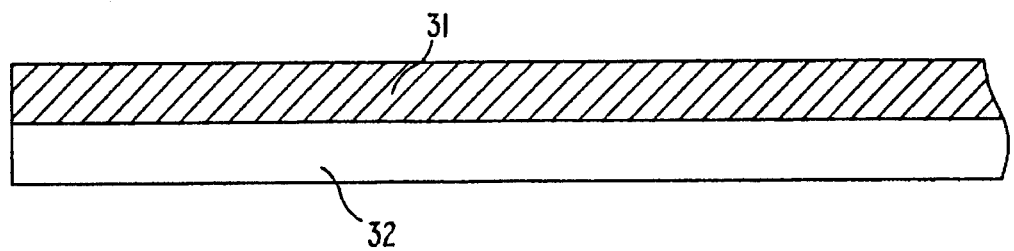

FIGS. 5a–g depict the process of forming cores making up a circuit board or card and subsequently forming the circuit board or card from the cores. FIG. 5a shows the power plane 28, which may be made of alternating layers of copper and INVAR with the through holes already formed therethrough. An insulating layer 29, which may be made of teflon or any other suitable electrical insulator, is laminated on to the power plane 28. (See FIG. 5b.) Circuitization in the form of a signal layer 30 is then formed over the surfaces of the insulating layer 29, as seen in FIG. 5d. At this point, the through holes 22 are plated with the plating material 23. With the addition of the circuitization and the plating on the plated through holes, the core is now fully formed, as also seen in FIG. 5d.

When joining together a plurality of cores, it is essential that full proper electrical connections be achieved between vertically aligned plated through holes and adjacent cores. Without full electrical connections, the integrated circuit chip or other component attached to the circuit board will not operate properly. Electrical connections have been achieved up to now by applying an upper and lower cap to each core. FIGS. 5e–i depict the formation of such a cap. Generally, a cap consists of a layer of electrically conductive material 31 joined to a layer of electrically insulating material 32. The electrically conductive layer may be formed of copper/Invar/copper or any other suitable electrically conducting materials. The insulating layer may be formed of TEFLON, filled TEFLON, such as TEFLON glass-filled TEFLON, epoxy glass laminates (e.g., FR4), polyimids, or any other such suitable insulator.

Figure 5F:
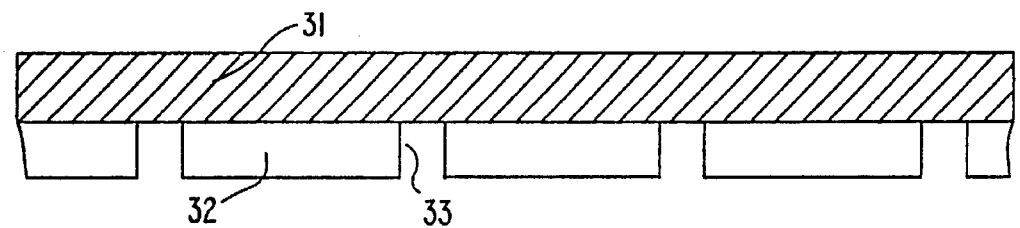
Figure 5G:
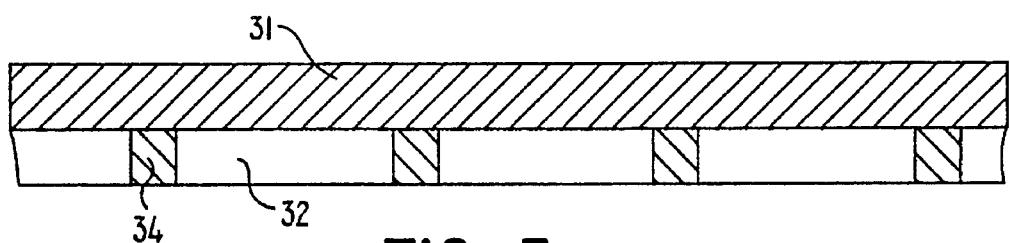

As seen in FIG. 5f, after the joining of the electrically conductive and insulating layers, via holes 33 are formed through the entire thickness of the insulating layer but not through the conductive layer. Next, an electrically conductive joining material 34 is deposited into each via hole using conventional electroplating techniques. This joining material may be a gold/tin alloy. The pattern with which the vias are formed in the electrically insulating material should match the pattern of formation of plated through holes in the core. The finished cap, prior to attachment to the core, may be seen in FIG. 5g.

Figure 5H:
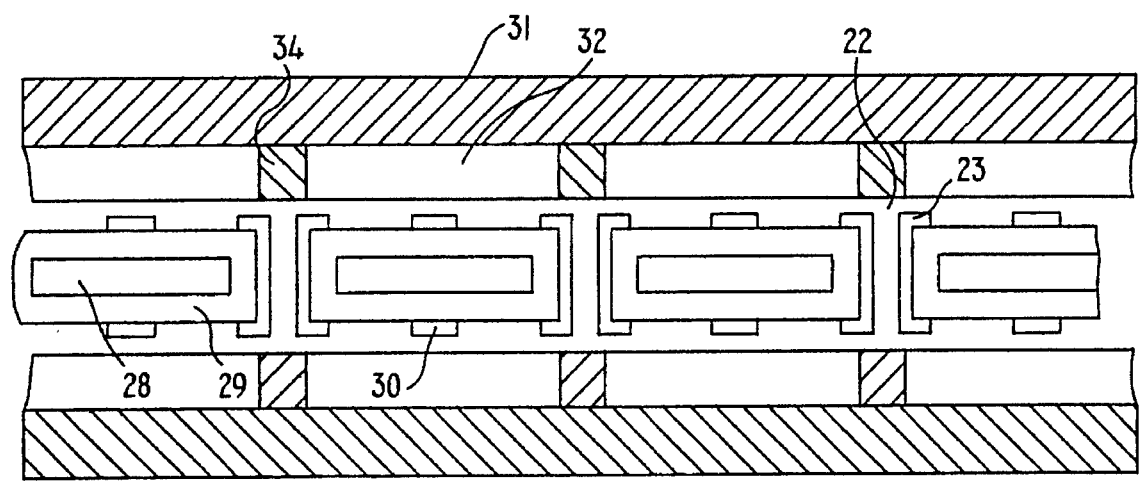
Figure 5I:
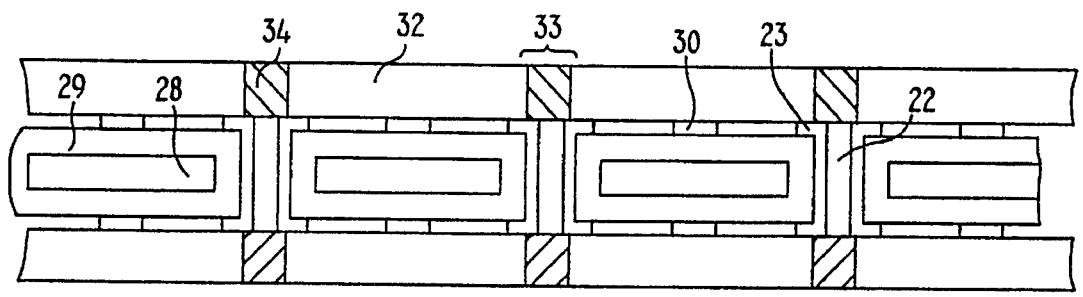
Figure 5J:
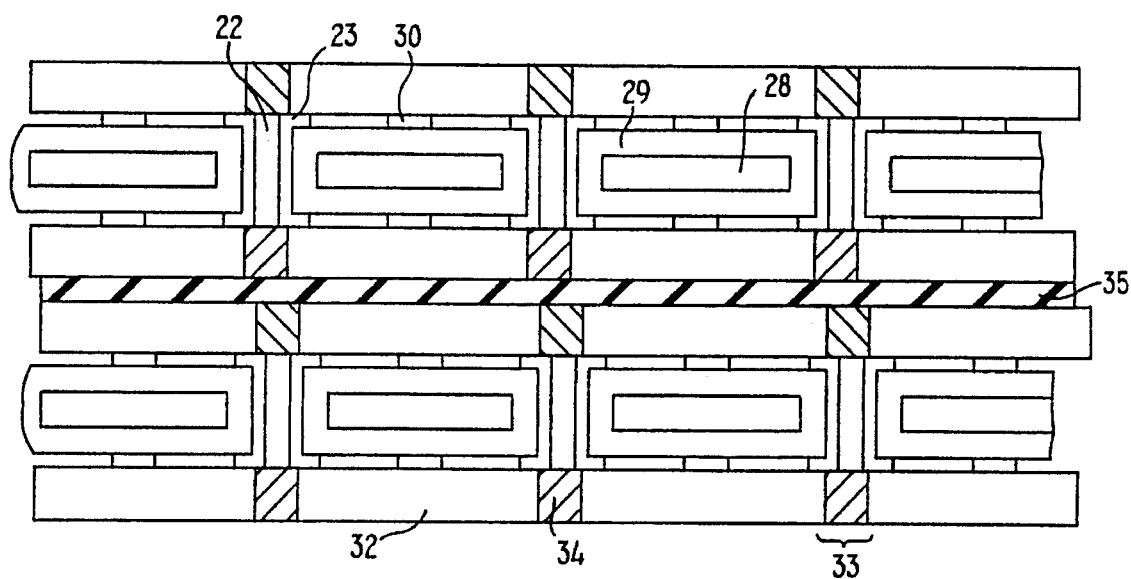

As seen in FIG. 5h, a cap is attached to each side of the core. Heat and pressure are used to bind the caps to the core. The electrically conductive layer of each cap is then etched away, leaving the structure seen in FIG. 5i. Once the electrically conductive layer is etched away, the cores, as seen in FIG. 5i, are then ready to be attached. The cores are laminated together using heat and pressure. This heat and pressure not only binds the cores together, but also ensures that the electrically conductive material deposited into the via holes of the caps becomes joined, providing electrical continuity through the plated through holes in the cores. The resulting structure, seen in FIG. 5j, includes two cores laminated together. A binding material 35 may be used to cause the cores to adhere to each other.

Although such a cap/core method of forming circuit boards and cards allows the high density of plated through holes to be achieved, the process has two distinct disadvantages. First, the etching away of the electrically conductive layer of each cap wastes time, money, and resources. Further, the electrically conductive material deposited in the vias of the cap does not completely fill the vertically aligned plated through holes and adjacent cores and therefore does not assure electrical continuity through the aligned plated through holes.

The present invention solves the problems existing in the cap to core method of joining circuitized power cores (CPC's), providing a "capless core" process of joining CPC's. Not only does the present invention eliminate the need to etch away the electrically conductive layer of the cap, it also eliminates the usage of gold used in filling the vias in the insulating layer of the cap and the concern of plating height uniformity inherent in the production of the caps and the concerns over discontinuity of the plated through holes. In addition, the present invention caplesscore process provides a greater flexibility to achieve via-via, blind via-blind, via, and via-via-blind via joints as well as allowing the adhesion layer to be applied last and independently. The present invention also eliminates other concerns including Au-Au or AuSn bonding which require optimum pressure and temperature, Au and AuSn plating height uniformity, pad to pad and via to via registration, and AuCu intermetallic formation during the cap-core bond process. In the capless core process of the present invention, gold plated copper balls on the vias/pads are used to join capless CPC's. The present invention relates to a new apparatus and method for forming circuit boards and cards and circuit boards and cards formed using such a capless core process.

According to preferred aspects of the present invention, the core or CPC is formed as described above. A layer of TEFLON or other dielectric 36 may plated or laminated over the circuitization 30 and the insulating layer 29. The apparatus used in the process of joining the CPC's according to the present invention preferably includes means to guide solder balls to the correct location on a CPC. The ball guiding means in the embodiment shown in FIG. 6a includes a ball dispenser 100 seen in cross section in FIG. 8.

The ball dispenser includes a housing 101 with an inner chamber 104. The housing includes a top surface 102 which is approximately the same size as the capless core. The surface 102 generally incudes a plurality of passages 103 formed to match the pattern of plated through holes in the capless core. The holes 103 pass completely through the surface 102 into the interior 104 of the housing 101. In a preferred embodiment, the holes are about 0.025 inch in diameter and are used with balls about 0.020 inch in diameter.

Projecting away from the surface 102 are at least two location pins 105 designed to facilitate the alignment of the capless core and a fixture base plate placed thereon. The ball dispenser also includes a connecting means 106 for connecting a source of pressurized gas to the ball dispenser 100. The interior 104 of the ball dispenser may be filled with balls either through the openings 103 formed in the template 102 forming one surface of the ball dispenser, through the connection 106 for connecting a source of pressurized gas, or alternatively, the ball dispenser may include an additional opening for receiving the balls. Alternatively, the template or other part of the frame 101 of the ball dispenser may be hinged or be removably attached to the ball dispenser so as to provide access to the interior of the ball dispenser.

Figure 6A:
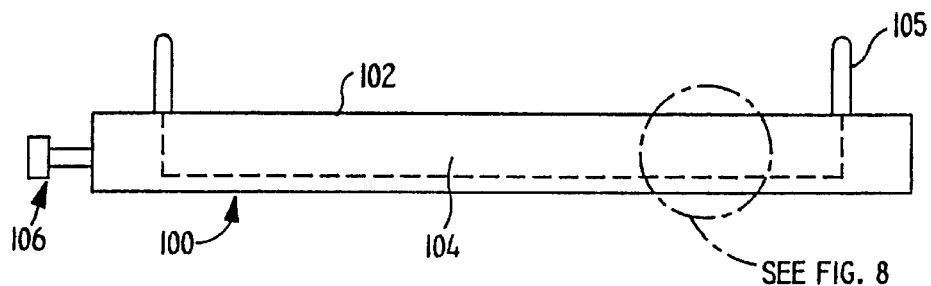
FIG. 6a represents a cross sectional view of one embodiment of the ball dispenser of the present invention.

The capless cores or CPC's may be provided with passages to engage the location pins located on the surface 102 of the ball dispenser 100. As seen in FIG. 6a, the ball dispenser may include two location pins or any number of location pins necessary to ensure that the capless core, when placed on the ball dispenser, will be properly aligned such that the plated through holes in the core will be vertically aligned with the passages in the template of the ball dispenser. Of course, other means for alignment of the core on the template may be employed, such as optical alignment means.

Also included in the apparatus of the present invention is a fixture base plate 113. The fixture base plate 113 includes a substantially flat surface 107 designed to abut the capless core 112 when the base plate is placed on the ball dispenser 100. By overlaying substantially the entire surface 102 of the capless core, the fixture base plate 113 secures the core 112 to the ball dispenser 100 ensuring that the core will remain in contact with the ball dispenser when pressurized gas is introduced into the interior of the ball dispenser as described below.

To ensure the proper positioning of the base plate on the ball dispenser, the base plate is equipped with passages corresponding in the placement in the base plate to the location of the location pins projecting from the ball dispenser. Additionally, the base plate may include screws or bolts 109 which may extend into passages 110 and 111 in the capless core and ball dispenser respectively. The securing pins 109 may provide a means of attaching the base plate to the ball dispenser and securing the capless core therebetween.

The balls used to secure the capless cores together may be formed from an inner core of copper with a precise volume of gold plated on the outside. Other materials may be suitable for use as ball material in the present invention, such as high temperature PbSn, which includes 95% lead and 5% tin, and copper without gold plated on the exterior of the ball. However, regardless of what material is used to form the solder balls, the main requirement for the material making up the balls is that it have a higher melting point than the material used to plate the through holes on the capless core. This differential melting point makes it possible to subject the capless cores to a soldering process which will melt the material plating the through holes causing it to flow and surround and adhere to the balls but not melt the balls. Preferably, the solder balls of the present invention are spherical.

Figure 8:
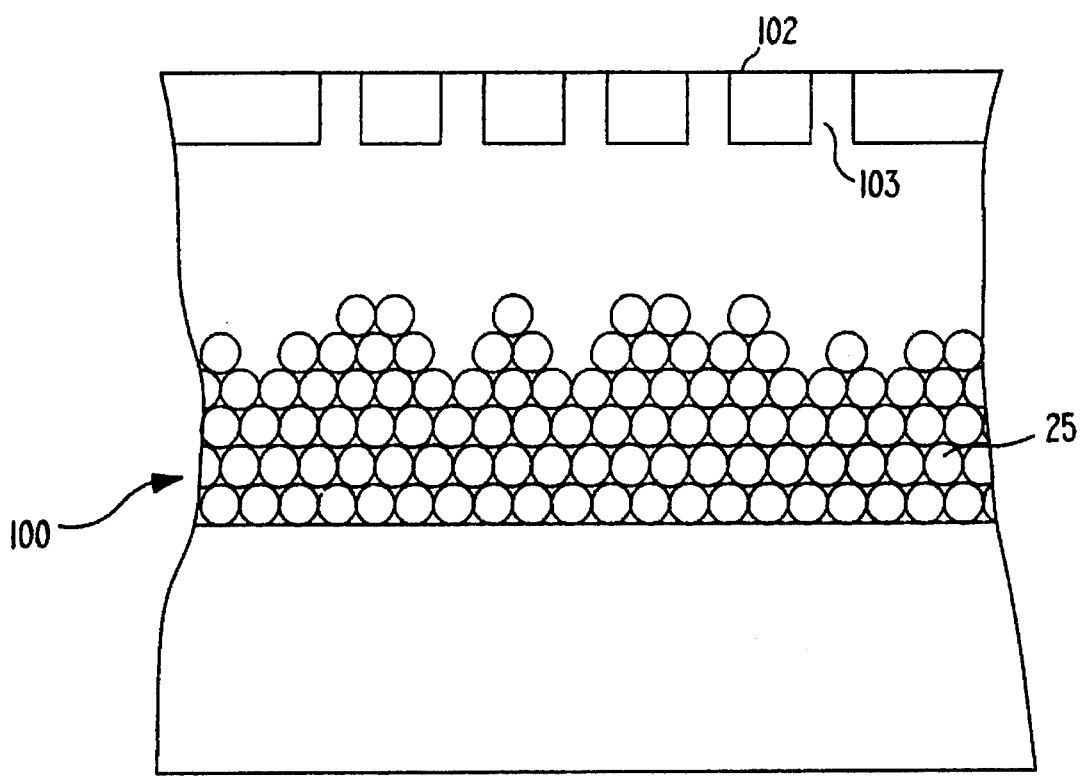
FIG. 8 represents a close-up cross sectional view of one embodiment of the ball dispenser of the present invention filled with balls.

When forming a multi-layer structure from circuitized power cores according to the present invention, the ball dispenser assembly is first filled with balls. A close-up cross sectional view of the ball dispenser assembly filled with balls may be seen in FIG. 8. As seen in FIG. 8, the balls are placed within the ball dispenser 100 and the interior cavity 104 thereof. The passages 103 in the template 102 are only slightly larger than the diameter of the balls so as to permit only a single line of balls to pass through the passages 103 at one time. The ball dispenser with the enclosed balls is placed on a flat surface with the template and location pins facing upward.

Figure 6B:
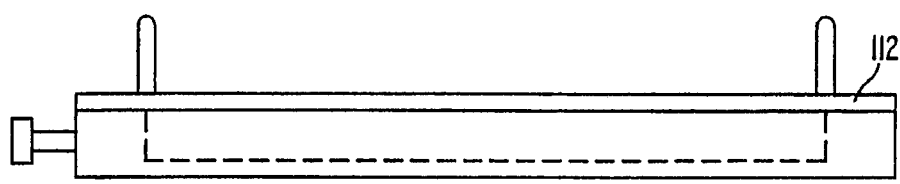
FIG. 6b represents a cross sectional view of one embodiment of the ball dispenser of the present invention with one embodiment of a capless core of the present invention attached thereto.
Figure 6C:
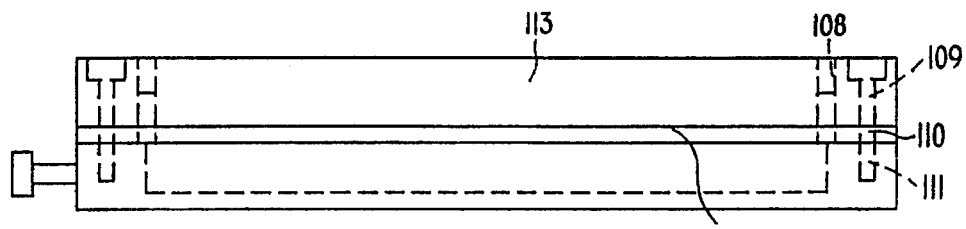
FIG. 6c represents a cross sectional view of one embodiment of the present invention with the ball dispenser capless core and fixture base plate secured together.

Once the ball dispenser assembly is filled with balls, the capless core is placed on the ball dispenser and guided into position by the location pins 105. As seen in cross section in FIG. 6b, the capless core 112 seen in cross section in FIG. 5d, lays flat on a template and should contact the template over its entire area.

With the capless core placed on the ball dispenser, the fixture base plate 113 is then placed on top of the capless core. The fixture base plate is guided into the proper position by the location pins 105 and is secured by securing means 109. The securing means 109 may be screws or other means which may secure the fixture base plate to the capless core and ball dispenser assembly, maintaining the base plate/core/ball dispenser secured together.

Figure 6D:
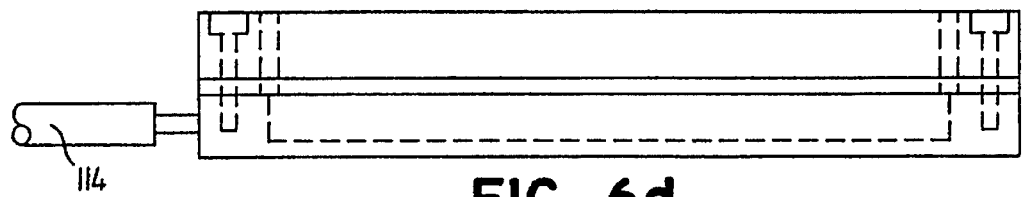
FIG. 6d represents a cross sectional view of one embodiment of the ball dispenser of the present invention with one embodiment of the capless core of the present invention and one embodiment of the fixture base plate attached thereto with a source of pressurized gas connected to the ball dispenser.

With the securing of the base to the capless core and ball dispenser, a source of pressurized gas (not shown) including a connection member 114 is attached to the gas connection member 106 on the ball dispenser. Pressurized gas may then be introduced into the interior 104 of the ball dispenser 100. The pressure exerted on the interior walls of the ball dispenser causes the interior cavity 104 in which the balls are contained to inflate, causing the template 102 to press against the capless core which is then caused to push against the fixture base plate. By forcing the template into contact with the core and the core into contact with the base plate, the gas pressure helps to assure that the balls will be guided through the template openings to the capless core and plated through holes and not wedged between the capless core and the fixture base plate or between the template and the capless core. The ball dispenser/capless core/fixture base plate assembly with the attached source of pressurized gas may be seen in FIG. 6d.

Figure 7A:
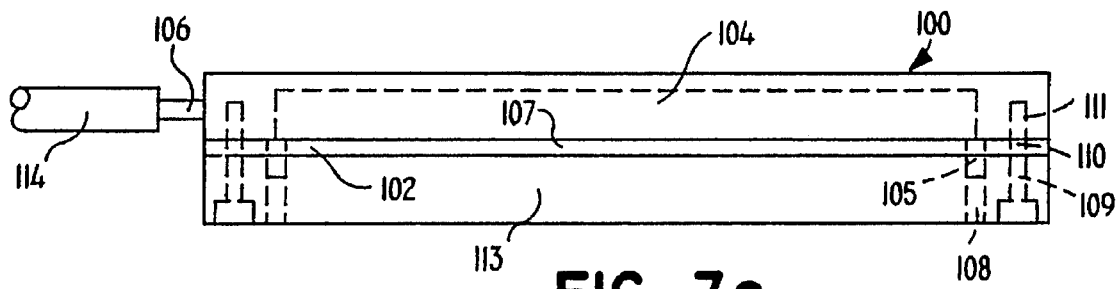
FIG. 7a represents a cross sectional view of the assembly seen in FIG. 6c with the ball dispenser, core, and base plate assembly inverted.
Figure 9:
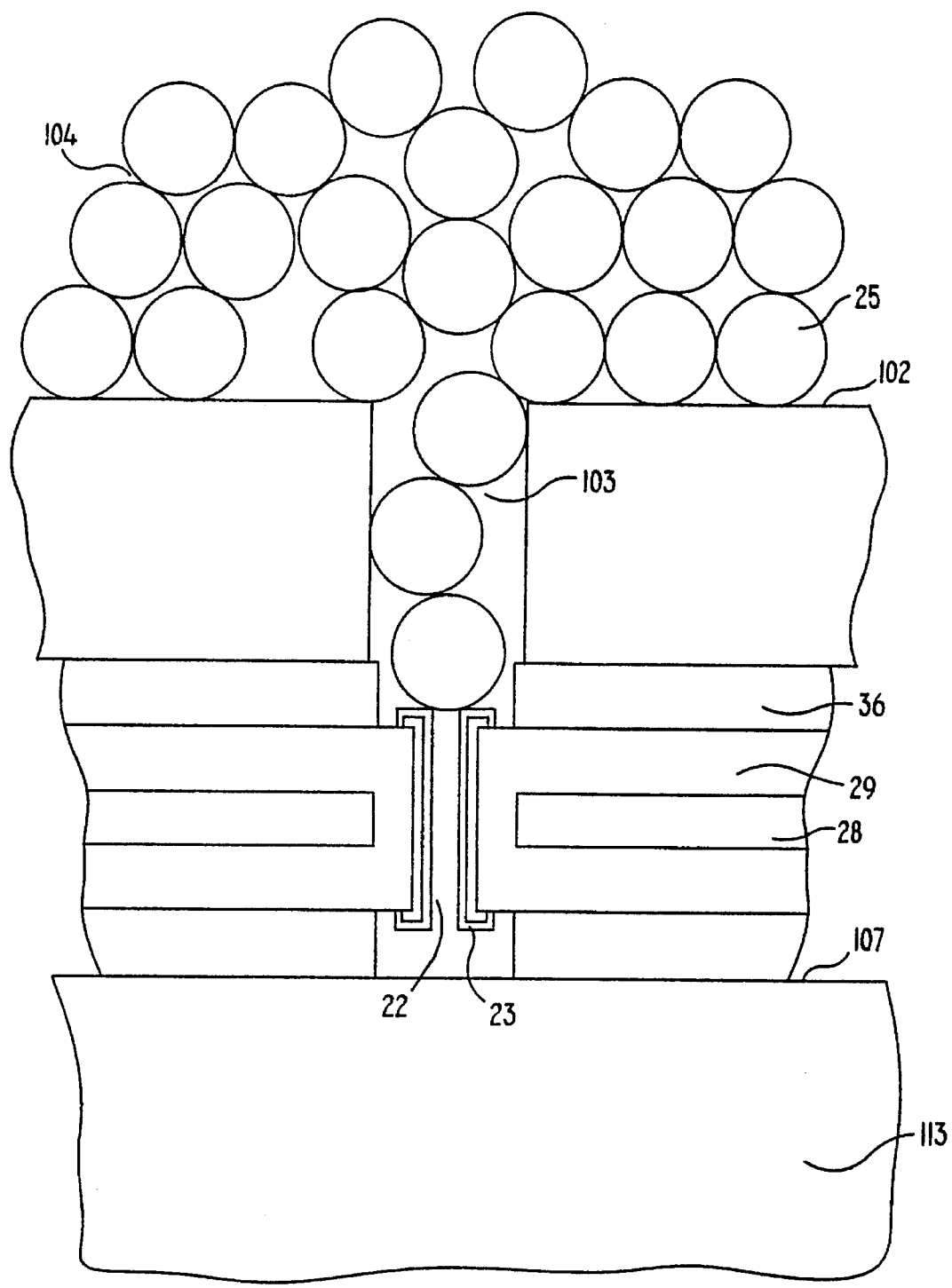
FIG. 9 represents a close-up cross sectional view of the embodiment of the present invention seen in FIG. 7b.

After the introduction of the pressurized gas into the ball dispenser, the ball dispenser capless core and base plate are inverted as seen in FIG. 7a. The combination ball dispenser/capless core/base plate (the apparatus) is then vibrated. Vibration of the apparatus helps to ensure that a ball will be deposited in every template hole and forced into contact with the openings of the plated through holes on the capless core. A close-up view of the apparatus after undergoing this inversion and vibration process may be seen in FIG. 9. As seen in FIG. 9, the passages 103 in the template 102 are only wide enough to permit balls singly to enter the hole 103. The inversion and vibration causes the balls 115 to move through the template and into contact with the capless core 112. As seen in FIG. 9, the balls 115 will be in direct contact with the plating material 23 of the plated through holes.

Figure 7B:
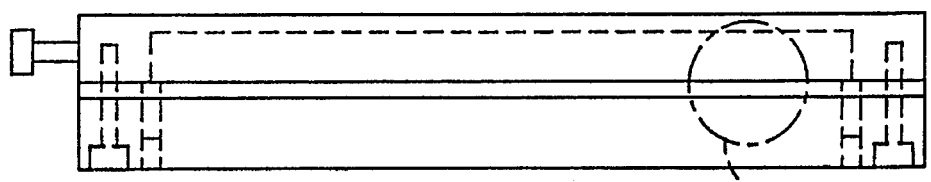
FIG. 7b represents the assembly seen in FIG. 7a with the source of pressurized gas disconnected.
Figure 7C:
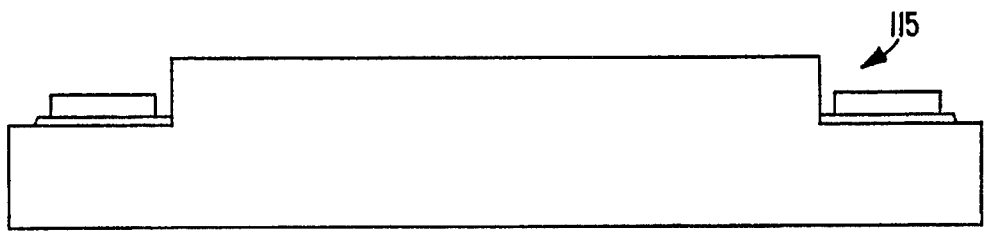
FIG. 7c represents a schematic view of a reflow machine that may be employed to reflow the solder balls to the cores according to one embodiment of the present invention.
Figure 7D:
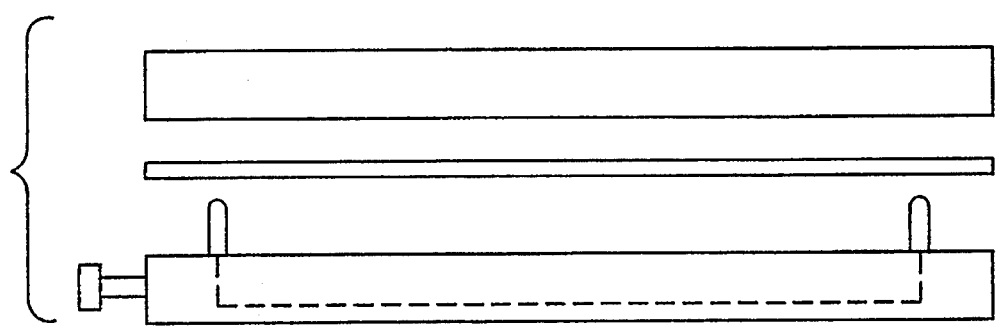
FIG. 7d represents the disassembly of the ball dispenser, capless core, and base plate assembly.

With the balls in contact with the plated through holes, the gas pressure is turned off and the source of pressurized gas is removed as seen in FIG. 7b the entire apparatus is then subjected to a reflow process. The apparatus may be subjected to means to cause the plating material on the plated through holes and the vias on the capless core to reach a temperature of approximately 200°–240° C. thereby melting the tin included in the plating material. For instance, the apparatus may be subjected to heating phase vapors in a vapor phase machine. The heating apparatus 115 may be seen schematically in FIG. 7c. Using gold plated copper balls, which have a reflow temperature of approximately 1,062° C., and a combination of lead and tin, which has a much lower reflow temperature, to plate the through holes, will result in the reflow of only the plating material and not the gold plated balls. Examples of combinations which may be used in the plating material include approximately 63% lead and approximately 37% tin which has a reflow temperature of approximately 183° C. and a combination of approximately 95% lead and approximately 5% tin which has a reflow temperature of approximately 330° C. These are only two examples of materials which may be used to plate the thorough holes in the capless core.

When the reflow temperature of the plating material is achieved, the melted tin will wet the gold plated copper balls, flowing around them and securing them to the core. After the apparatus has been subjected to the heating process for an appropriate amount of time, the apparatus is removed from the heating means and the apparatus is allowed to cool. The plating material is then allowed to solidify around the gold balls, securing them in place. Once the cooling is completed, the apparatus is returned to an upright position, as shown in FIG. 7, and the means used to secure the fixture base plate to the core and ball dispenser is removed. The base plate may then be removed from the core and the ball dispenser and then the capless core may be removed from the ball dispenser.

Figure 10:
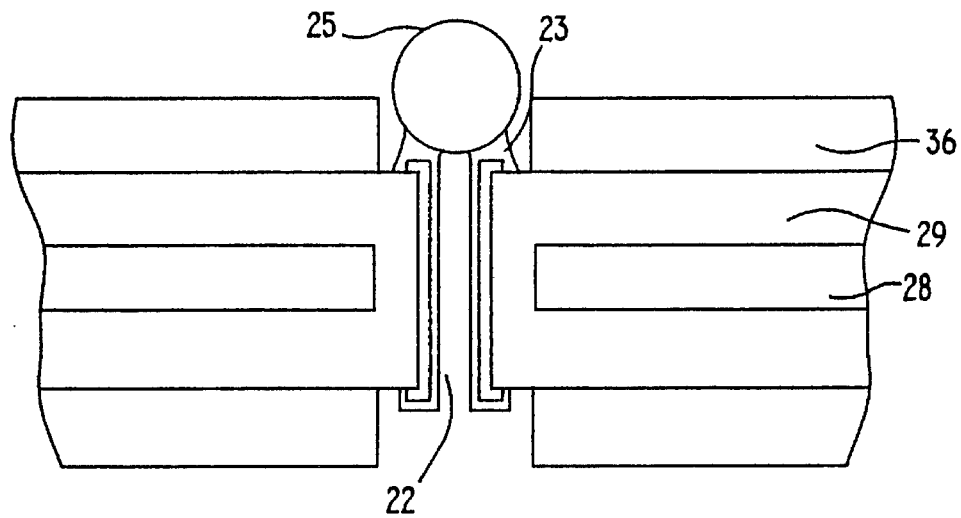
FIG. 10 represents a cross sectional view of one embodiment of the capless core of the present invention after undergoing a soldering process.

The result of the ball securing operation, seen in close-up cross sectional view in FIG. 10, shows that the balls 25 are secured to the capless core by the plating material 23 plating the through holes 22 in the capless core. As seen in FIG. 10, the reflow material has at least partially flowed up around the sides of the ball 25 to secure the ball in place. A ball should be attached at each via on the capless core.

Figure 11:
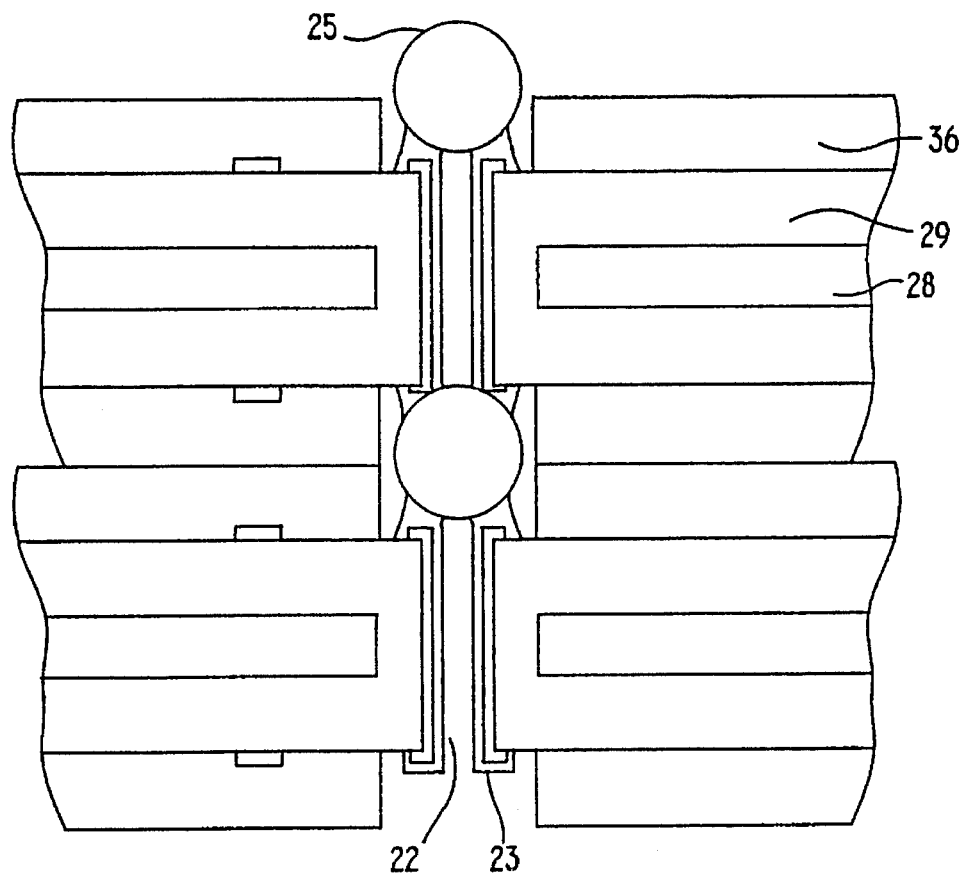
FIG. 11 represents a multi-layer capless core assembly of the present invention which may be formed according to the method of the present invention.

A multi-layer circuit board or card may be formed by placing a first core with the balls attached on a second capless core with the balls attached so that the balls on the one core engage the open through holes on the other. The two cores are then subjected to a process causing the plating material on one core to flow about the balls attached to the other. Additional cores may be secured to the stack of two or an integrated circuit chip may be attached to the two cores using direct chip attachment methods. Alternatively, balls may be secured to the plated through holes on one end of the stack of cores. This may be done by placing the stack of cores on the ball dispenser and subjecting it to the ball securing process described above. An IC chip may then be attached to the stack of cores using direct chip attachment methods as described above. Two cores secured together may be seen in FIG. 11.

Capless cores for use with the present invention may for example include a power layer approximately 0.001 inches thick surrounded by approximately 0.002 inches of insulating layer on both sides and another approximately 0.002 inches of insulating material on both sides of the first layer of insulating material. The material plating the through holes in the capless core may be copper with tin or alternatively copper with tin lead solder plate.

Although they may be made of various sizes, multi-layer printed circuit boards and/or cards formed according to the present invention typically are up to about 24 by 28 inches in size. A typical board may be up to about 0.100 inch thick. A board of this thickness typically is formed from about 8–10 circuitized power cores which are typically about 0.090 inch thick.

The solder balls used to join the CPC's are typically about 0.020 inch in diameter. To achieve the optimum operation of the present invention, the solder balls should be about 20% larger than the diameter of the plated through holes, more favorably, at least 50%, and typically, are twice as large as the diameter of the plated through holes. Additionally, the holes in the ball dispenser are preferably about 25% larger than the solder balls so as to make it possible for the balls to easily enter the holes in one line and not jam the hole.

The plated through holes in the circuit board or card may be up to 0.020 inch in diameter prior to plating and are typically 0.010 inch in diameter. The diameter of the through holes is reduced by the plating. Typically, the plating includes two layers, a first layer of copper which is typically 0.002 inch thick and a second layer of lead/tin which typically is about 0.002 inch thick.

We claim:

1. A method of making a printed circuit board or card, comprising the steps of:

a) forming a circuitized power core by depositing an electrically insulating material on a top side and a bottom side of a planar electrically conductive layer material;

b) forming a plurality of holes through said circuitized power cores from said top to said bottom;

c) plating electrically conductive material on the surface of the through holes and on the top and bottom surfaces of the electrically insulating layer of the circuitized power core adjacent each through hole, said material on the inside of said holes being continuous with the material on the top and bottom of the circuitized power core;

d) placing within a ball dispenser assembly a plurality of substantially spherical balls having a diameter slightly larger than the diameter of said plated through holes in said circuitized power core and being made of electrically conductive material, said balls being arranged in a pattern matching the pattern of through holes formed in said circuitized power core;

e) placing said circuitized power core over said planar surface on said ball dispenser assembly, aligning said plated through holes with holes in an exterior surface of said ball dispenser assembly, wherein said holes in said ball dispenser are slightly larger than said balls, and aligning location pins provided in said dispenser with location holes in said power core;

f) placing a fixture base plate over said power core and securing said base plate to said ball dispenser;

g) introducing pressurized gas into said ball dispenser causing said exterior surface to press against said power core and said power core to press against said base plate;

h) inverting said ball dispenser, power core and base plate;

i) vibrating the ball dispenser, power core and base plate, causing said balls to pass through said passages in said exterior surface and become wedged at the opening of said plated through holes;

j) turning off said source of pressurized gas;

k) heating the ball dispenser, power core and base plate to a temperature which melts only the material plated on the through holes;

l) reverting the ball dispenser, power core, and base plate; and m) removing said base plate and said power core from said ball dispenser.

* * * * *